United States Patent
Solal et al.

(10) Patent No.: US 12,512,813 B2
(45) Date of Patent: Dec. 30, 2025

(54) LATERAL FIELD EXCITATION ACOUSTIC RESONATOR

(71) Applicant: Qorvo US, Inc., Greensboro, NC (US)

(72) Inventors: Marc Solal, Longwood, FL (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 345 days.

(21) Appl. No.: 18/113,657

(22) Filed: Feb. 24, 2023

(65) Prior Publication Data

US 2023/0291380 A1   Sep. 14, 2023

Related U.S. Application Data

(60) Provisional application No. 63/268,989, filed on Mar. 8, 2022.

(51) Int. Cl.
| | |
|---|---|
| *H03H 9/05* | (2006.01) |
| *H03H 3/02* | (2006.01) |
| *H03H 3/04* | (2006.01) |
| *H03H 9/13* | (2006.01) |

(52) U.S. Cl.
CPC .......... *H03H 9/0542* (2013.01); *H03H 3/04* (2013.01); *H03H 9/13* (2013.01); *H03H 2003/023* (2013.01); *H03H 2003/0457* (2013.01)

(58) Field of Classification Search
CPC .......... H03H 9/0542; H03H 3/04; H03H 9/13; H03H 2003/023; H03H 2003/0457; H03H 9/174; H03H 2003/025; H03H 3/02; H03H 9/02228; H03H 9/02015; H03H 9/131; H03H 9/132; H03H 9/175
USPC ................................. 333/186–188, 193–196
See application file for complete search history.

(56) References Cited

U.S. PATENT DOCUMENTS

| | | | |
|---|---|---|---|
| 2006/0131998 A1* | 6/2006 | Aoki | H03H 3/08 310/340 |
| 2007/0267942 A1* | 11/2007 | Matsumoto | H03H 9/178 310/366 |
| 2021/0167752 A1* | 6/2021 | Caron | H03H 9/205 |
| 2022/0014175 A1* | 1/2022 | Nagatomo | H03H 9/14541 |
| 2022/0123720 A1* | 4/2022 | Garcia | H03H 9/171 |
| 2023/0037168 A1* | 2/2023 | Cardona | H03H 9/171 |

OTHER PUBLICATIONS

Assila, N. et al., "High Frequency Resonator Using A1 Lamb Wave Mode in LiTaO3 Plate," IEEE Transactions on Ultrasonics, Ferroelectrics, and Frequency Control, vol. 66, Issue 9, Sep. 2019, first published Jun. 2019, IEEE, 7 pages.

(Continued)

*Primary Examiner* — Jorge L Salazar, Jr.
(74) *Attorney, Agent, or Firm* — Withrow & Terranova, P.L.L.C.

(57) ABSTRACT

Lateral field excitation acoustic resonators and methods of manufacture are disclosed. In one aspect, an acoustically resonating material such as a piezoelectric film or membrane is spaced from a substrate by electrodes having an air gap therebetween. When current flows through the electrodes, lateral field acoustic waves are excited in the resonating material with relatively good coupling and adequate heat dissipation.

18 Claims, 24 Drawing Sheets

(56) References Cited

OTHER PUBLICATIONS

Gong, S. et al., "Design and Analysis of Lithium-Niobate-Based High Electromechanical Coupling RF-MEMS Resonators for Wideband Filtering," IEEE Transactions on Microwave Theory and Techniques, vol. 61, Issue 1, Jan. 2013, first published Dec. 2012, IEEE, pp. 403-414.

Mcgann, J., "Piezoelectric Platforms for Bulk Acoustics Wave Sensor Applications," A Thesis Submitted in Partial Fulfillment of the Requirements for the Degree of Master of Science in Electrical Engineering, University of Maine, May 2017, 100 pages.

Plessky, V. et al., "Laterally excited bulk wave resonators (XBARs) based on thin Lithium Niobate platelet for 5GHz and 13 GHz filters," Electronics Letters, vol. 55, No. 2, Jan. 2019, pp. 98-100.

Solal, M. et al., "A 4.5 GHz surface excitation solidly mounted microacoustic resonator with 20% coupling," 2022 IEEE International Ultrasonics Symposium (IUS), Oct. 10-13, 2022, Venice, Italy, IEEE, 4 pages.

Turner, P.J. et al., "5 GHz Band n79 wideband microacoustic filter using thin lithium niobate membrane," Electronics Letters, vol. 55, Issue 17, Aug. 2019, pp. 942-944.

Wu, Z. et al., "Broadband piston mode operation of solidly mounted resonator employing A1 Lamb mode on lithium niobate," Japanese Journal of Applied Physics, vol. 60, No. SD, Mar. 23, 2021, 6 pages.

\* cited by examiner

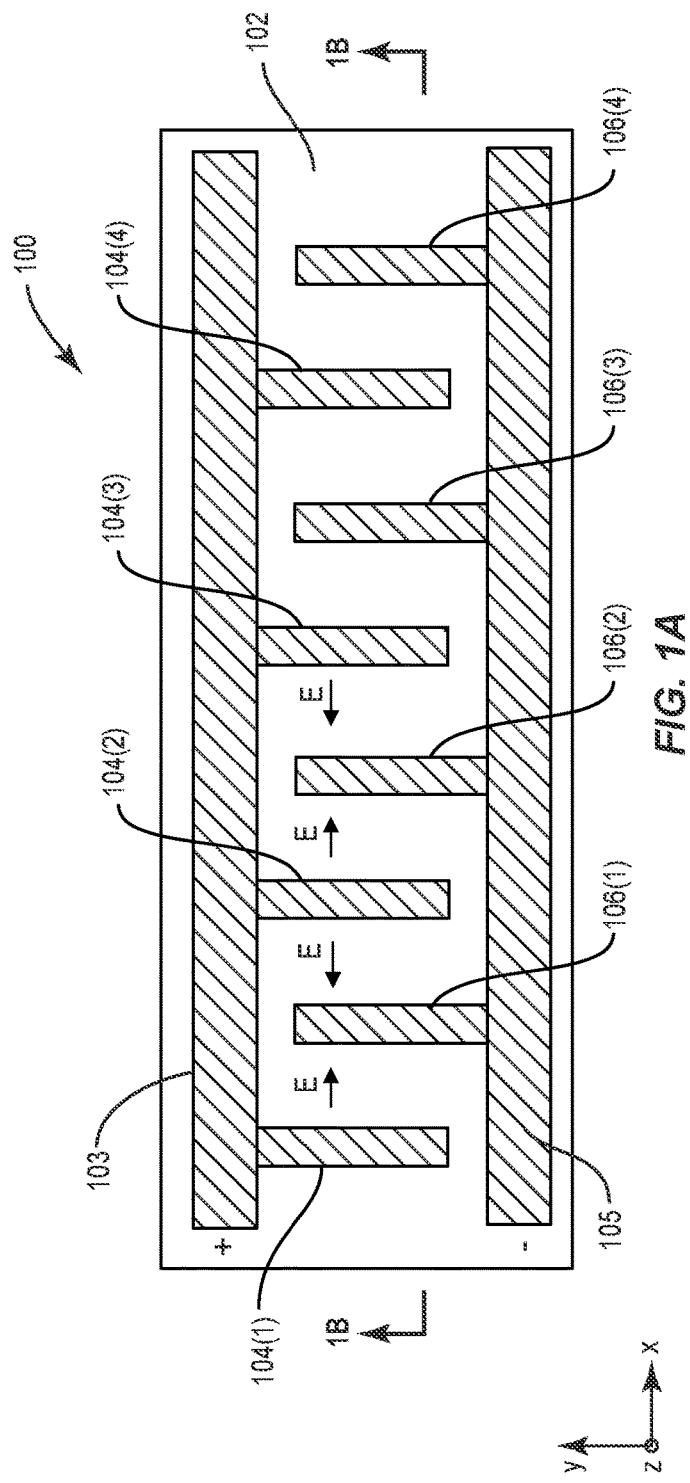
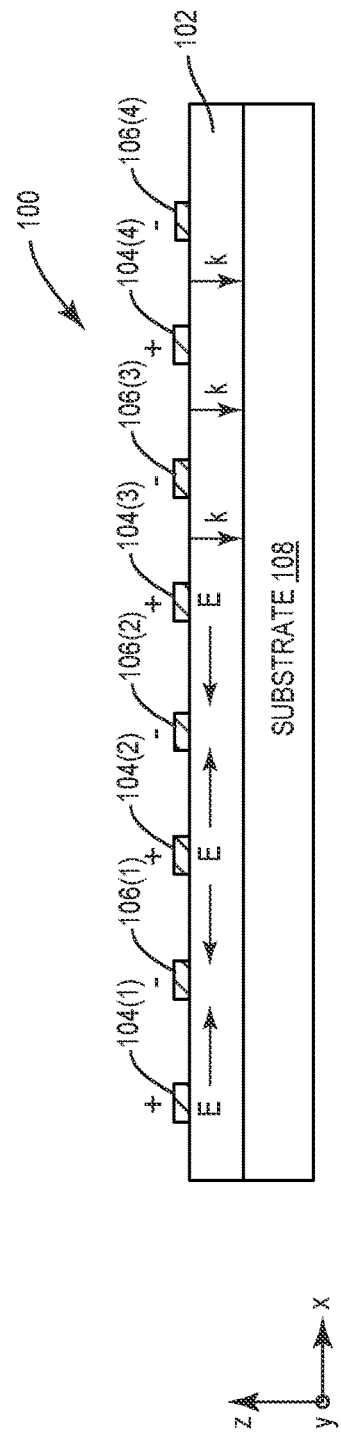
*FIG. 1A (RELATED ART)*
*FIG. 1B (RELATED ART)*

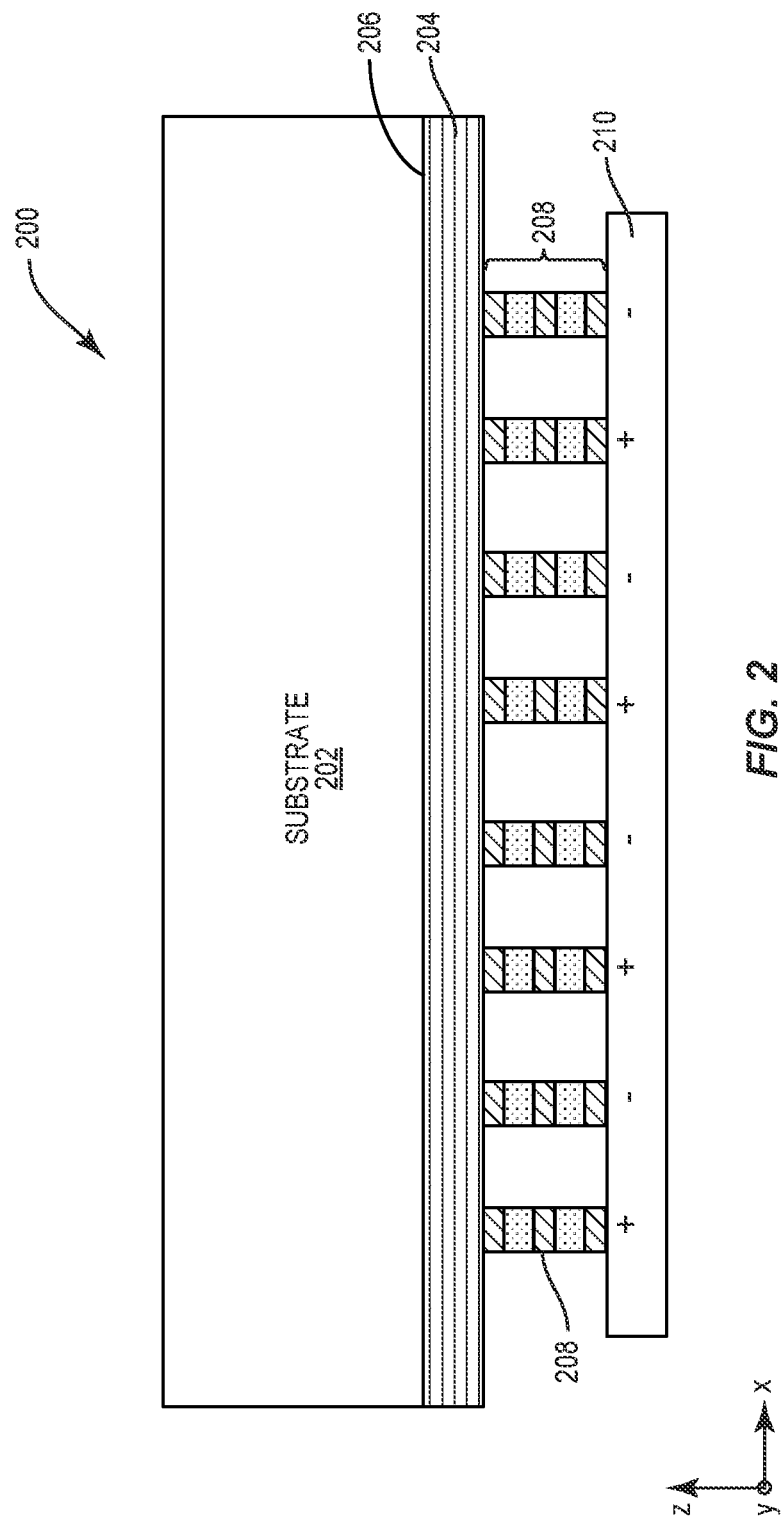

LATERAL FIELD EXCITATION ACOUSTIC RESONATOR

PRIORITY CLAIM

The present application claims priority to U.S. Provisional Patent Application Ser. No. 63/268,989 filed on Mar. 8, 2022, and entitled "LATERAL FIELD EXCITATION ACOUSTIC RESONATOR," the contents of which is incorporated herein by reference in its entirety.

BACKGROUND

I. Field of the Disclosure

The technology of the disclosure relates generally to acoustic resonators for use in high-power and high-frequency applications.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been an increased need for bandwidth in wireless communication. This need has caused the evolving cellular standards to steadily increase the base frequency at which wireless communication operate. Techniques that work for comparatively low frequencies may not be suitable for higher-frequency applications. Even when certain technologies may be useful at higher frequencies, the technologies may be complicated by the steady reduction in the size of electronic circuitry.

One area that has seen frequency and size challenges is in the field of acoustic filters such as surface acoustic wave (SAW) and bulk acoustic wave (BAW) filters. Accordingly, there is room for innovation in this space.

SUMMARY

Aspects disclosed in the detailed description include a lateral field excitation acoustic resonator and method of manufacture of the same. In particular, an acoustically resonating material such as a piezoelectric film or membrane is spaced from a substrate by electrodes having an air gap therebetween. When a voltage is applied to the electrodes, lateral field acoustic waves are excited in the resonating material with relatively good coupling and adequate heat dissipation.

In this regard, in one aspect, a resonator is disclosed. The resonator comprises a piezoelectric membrane for which excitation is done using electrodes at alternate polarities. The electrodes are placed between the piezoelectric membrane and a substrate.

In another aspect, a process to make the resonator is disclosed. The piezoelectric membrane is formed by bonding a piezoelectric membrane to the substrate on structures that are present.

In another aspect, a resonator is disclosed. The resonator comprises a substrate having a reflector positioned on a surface of the substrate and electrodes mounted on the reflector and further comprises a piezoelectric membrane for which excitation is done using the electrodes at alternate polarities

BRIEF DESCRIPTION OF THE DRAWINGS

FIG. 1A is a top plan view of a conventional acoustic wave resonator;

FIG. 1B is a cross-sectional side elevation view of the resonator of FIG. 1A taken along line 1B-1B;

FIG. 2 is a cross-sectional side elevation view of a resonator according to an exemplary aspect of the present disclosure showing a position of electrodes between a substrate and a piezoelectric material;

DETAILED DESCRIPTION

Figure 3:
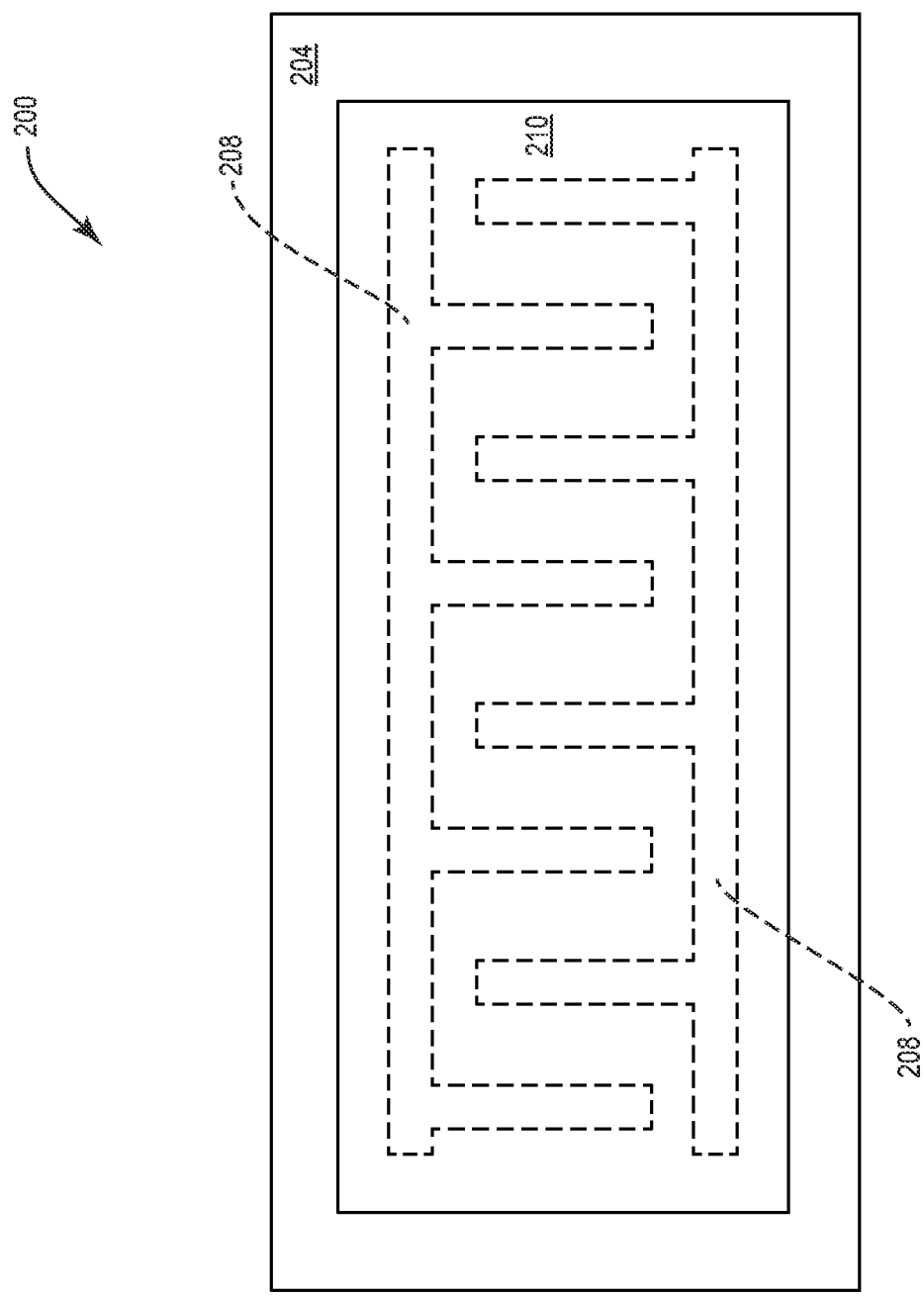
FIG. 3 is a bottom plan view of the resonator of FIG. 2.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a lateral field excitation acoustic resonator and method of manufacture of the same. In particular, an acoustically resonating material such as a piezoelectric film or membrane is spaced from a substrate by electrodes having an air gap therebetween. When a voltage is applied to the electrodes, lateral field acoustic waves are excited in the resonating material with relatively good coupling and adequate heat dissipation.

Before addressing exemplary aspects of the present disclosure, a brief discussion of a conventional approach to an acoustic resonator and its limitations is provided with reference to FIGS. 1A and 1B. A discussion of exemplary aspects of the present disclosure begins below with reference to FIG. 2.

In this regard, FIG. 1A is a top plan view of a conventional acoustic resonator 100, while FIG. 1B is a cross-sectional side elevational view of the same resonator 100 taken along line 1B-1B. The resonator 100 includes a piezoelectric material or film 102 positioned on top of a substrate 108 (FIG. 1B). Positive electrode 103 includes fingers 104(1)-104(4), and negative electrode 105 includes fingers 106(1)-106(4) positioned on the piezoelectric film 102. As better seen in FIG. 1B, the piezoelectric film 102 is positioned on top of the substrate 108. Electric fields E are generated that operate parallel to the surface of the piezoelectric film 102 (e.g., in the X axis) and are sometimes called lateral field excitation (LFE). In some cases, the piezoelectric film 102 may be separated from the substrate 108 by a gap (not shown in FIG. 1B). This gap may contribute to poor heat dissipation.

While the resonator 100 may provide desired filtering performance, power handling has proven to be an issue that may negatively impact performance at frequencies of interest (e.g., above 2.5 gigahertz (GHz)). In general, the structure of the resonator 100 has poor thermal dissipation because the piezoelectric film 102 generally has bad thermal conductivity. Heat extraction is likewise inefficient since the lateral (e.g., X-axis) dimension is generally long. One option would be to bond the piezoelectric film 102 on top of the substrate 108 with a multilayer reflector positioned between the piezoelectric film 102 and the substrate 108. Unfortunately, at least one metallic layer is used to obtain a good acoustic reflector. Due to the large period of the electrodes, the presence of the metal below the resonator leads to a stray capacitance between the electrodes, and the coupling is then reduced by a factor larger than two. This degradation of the coupling is undesirable.

Figure 7:
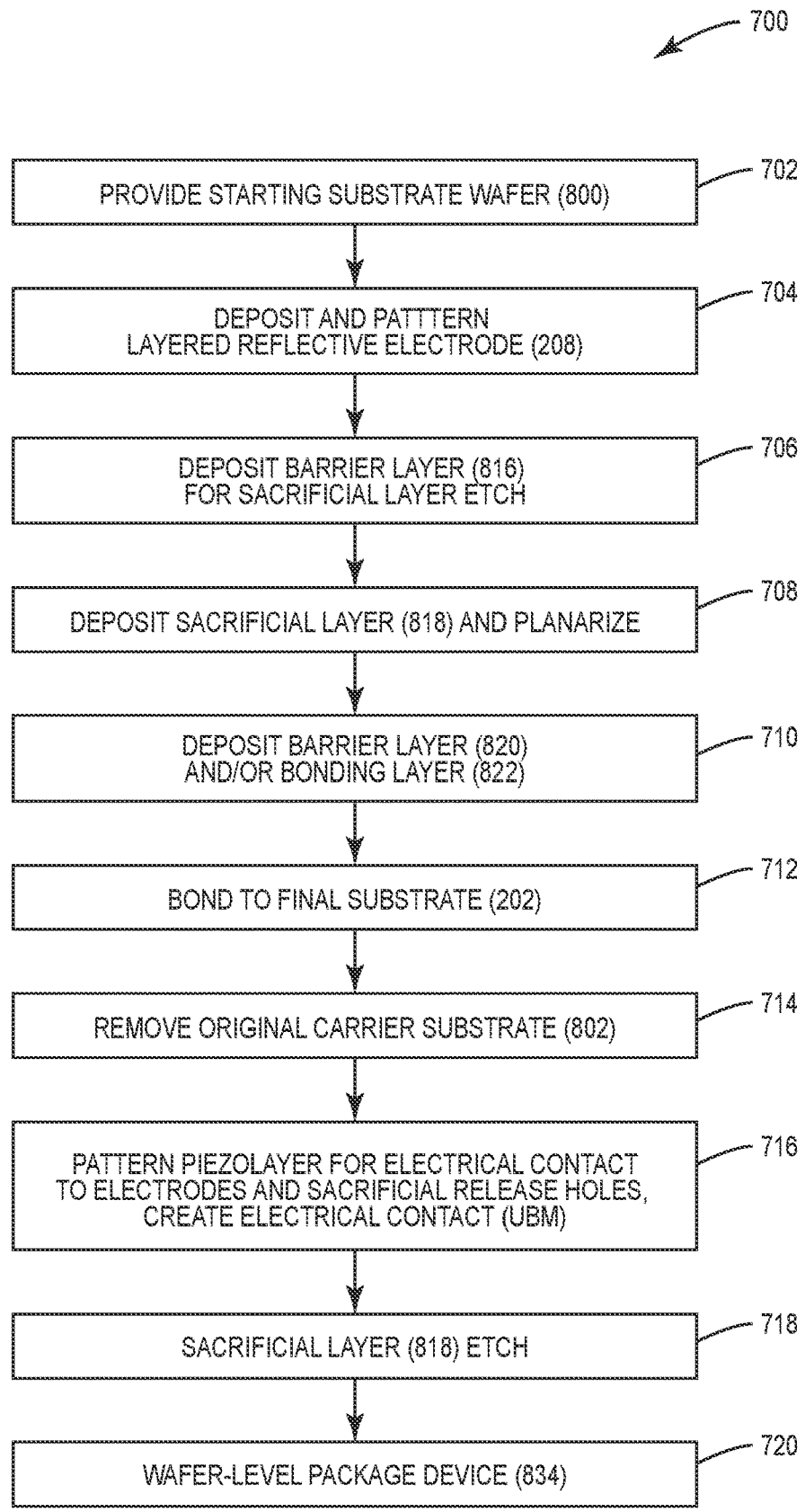
FIG. 7 is a flowchart of a method of manufacturing the resonator of FIG. 2.

Exemplary aspects of the present disclosure contemplate an acoustic filter that has a structure that provides strong coupling as well as good thermal dissipation. To achieve both results, exemplary aspects of the present disclosure position the electrodes between the substrate and the piezoelectric film with an air gap between electrodes. The discussion of this structure begins below with reference to FIG. 2. A method of making this structure is discussed with reference to FIG. 7-8J. Various additional void geometries within the piezoelectric film allow for reduced parasitic capacitance if needed or desired and are discussed below at FIGS. 9-13.

In this regard, FIG. 2 illustrates a resonator 200 having a substrate 202. An optional low permittivity layer 204 (e.g., Silicon Oxide ($SiO_2$)) is positioned on a surface 206 of the substrate 202. The low permittivity layer 204 may be used to reduce parasitic capacitance between electrodes 208. The electrodes 208 are positioned on the surface 206 of the substrate 202 (if the low permittivity layer 204 is absent) or, as illustrated, on the low permittivity layer 204. The electrodes 208 may, in this cross-sectional view, alternate positive and negative polarities with an interdigitated structure similar to that shown in FIG. 1A. While it is possible for the electrodes 208 to be formed from a uniform material, the electrodes 208 may be formed from alternating layers of low acoustic impedance and high acoustic impedance materials (e.g., Aluminum (Al) and Tungsten (W)) as better explained below with reference to FIGS. 7 and 8B. This alternating of materials allows the electrodes 208 to operate as acoustic reflectors. A piezoelectric film or membrane 210 is positioned on the electrodes 208.

FIG. 3 provides a bottom-up plan view of the resonator 200, where it can be seen that the electrodes 208 are underneath the piezoelectric film or membrane 210. The substrate 202 is not seen in FIG. 3 because it is beneath the low permittivity layer 204.

Figure 4:
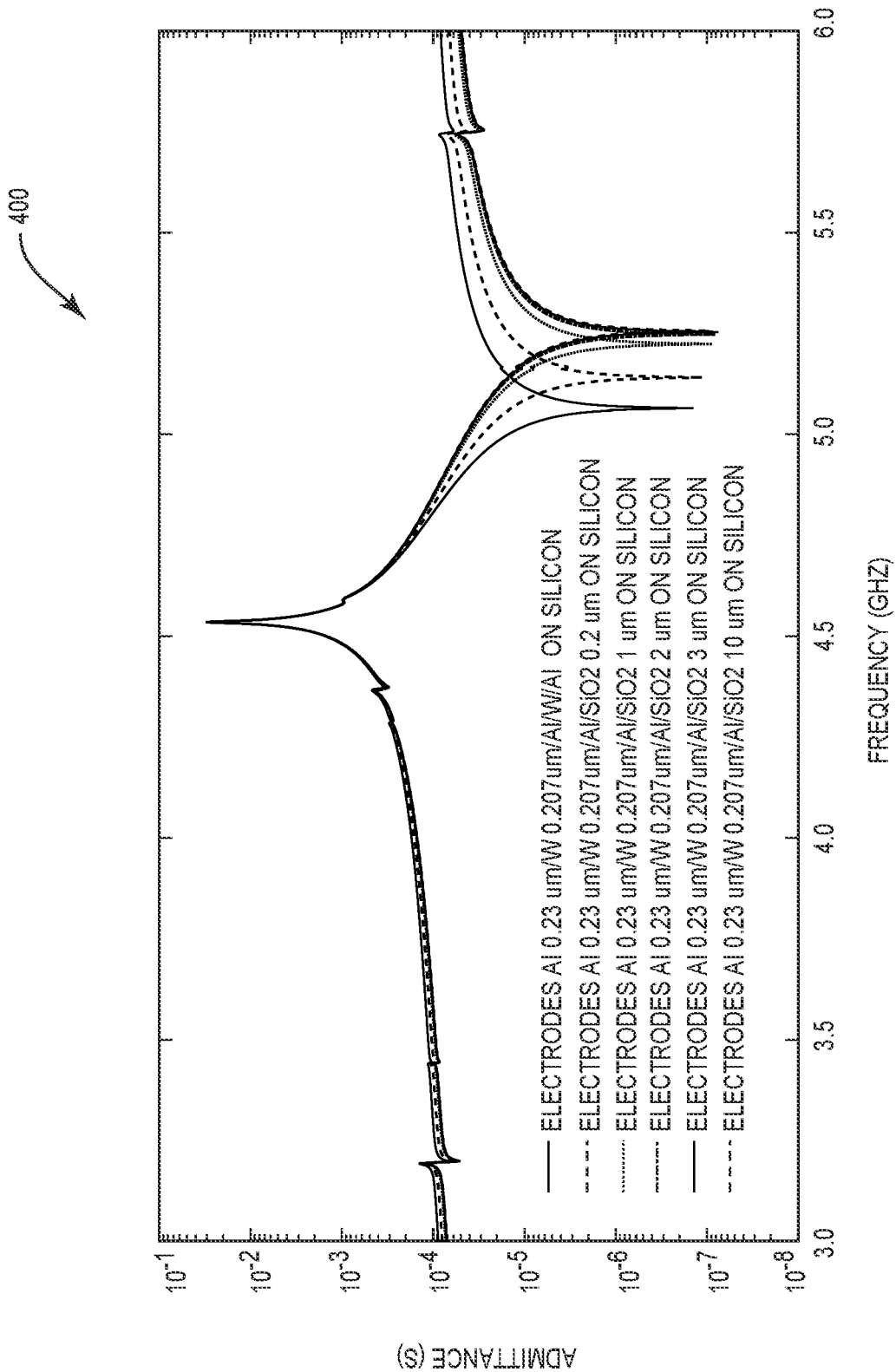
FIG. 4 provides an admittance versus frequency graph of the resonator of FIG. 2.

Graph 400 in FIG. 4 shows various admittances across frequencies for the resonator 200 with varied thicknesses for the low permittivity layer 204. The electrodes 208 are layered Al and W with a SiO layer varied between 0 and 10 μm for the different curves.

Figure 5:
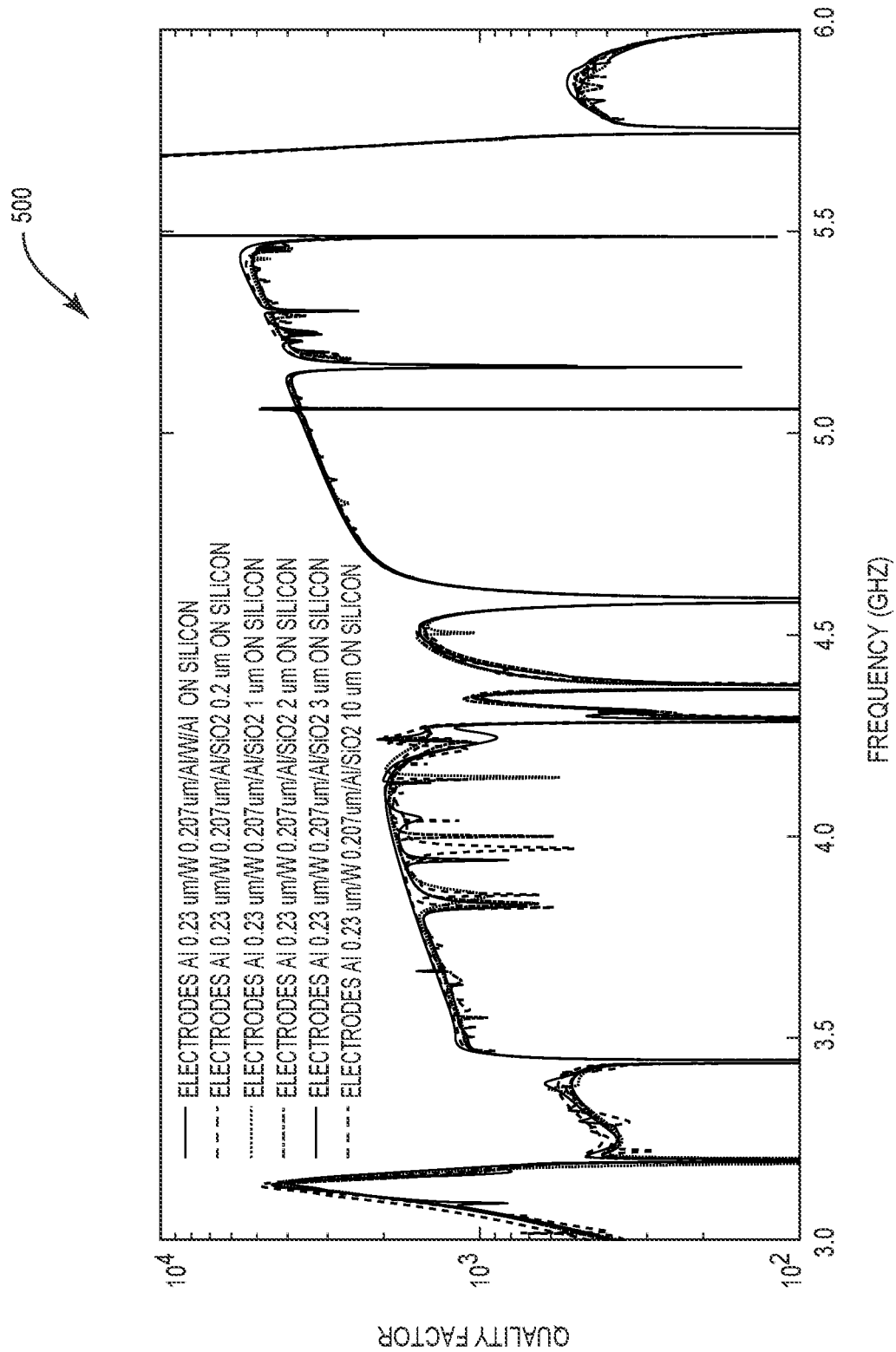
FIG. 5 provides a Q factor versus frequency graph of the resonator of FIG. 2.

FIG. 5 shows, through graph 500, various Q factors across frequencies for the resonator 200 with varied thicknesses for the low permittivity layer 204. Again, the electrodes 208 are layered Al and W with a SiO layer varied between 0 and 10 μm for the different curves.

Figure 6:
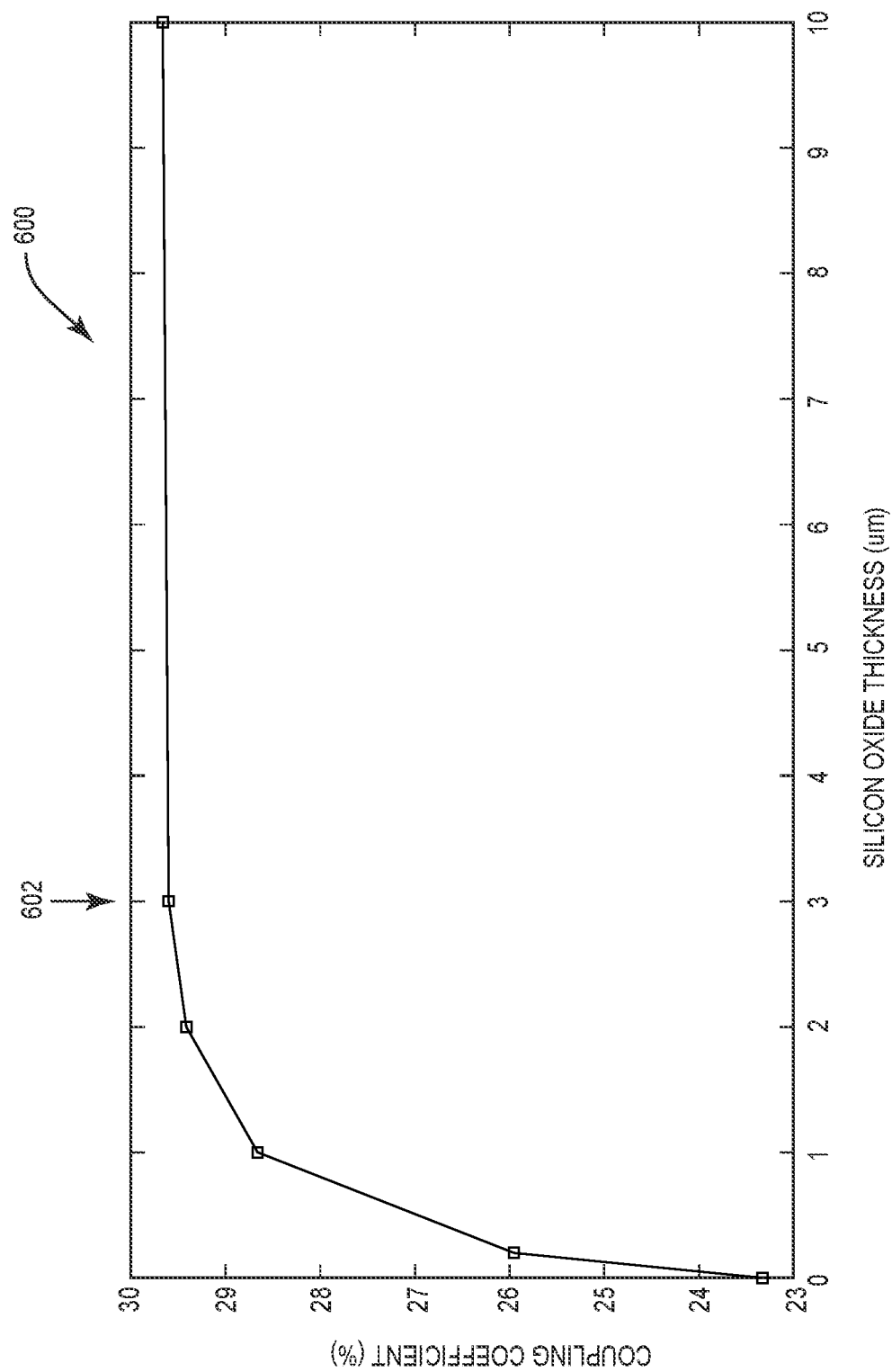
FIG. 6 provides a coupling coefficient versus thickness of a low permittivity layer in the resonator of FIG. 2.

FIG. 6 provides a graph 600 showing a coupling coefficient relative to the thickness of the low permittivity layer 204. Specifically, the coupling factor approaches a maximum of just below 30% at a thickness of about 3 μm (generally point 602).

FIGS. 7 and 8A-8J illustrate a process 700 used to make the resonator 200. Specifically, the process 700 begins by providing a starting substrate wafer 800 (block 702, see FIG. 8A). The substrate wafer 800 may include a carrier substrate layer 802, which may be silicon (Si), glass, or the like. Further, the substrate wafer 800 may have the piezoelectric film, or membrane 210 positioned on the carrier substrate layer 802 using a bonding interface or bonding layer 804. The piezoelectric membrane may be lithium niobate, lithium tantalate (LiTaO$_3$)

The process 700 continues by depositing and patterning the layered reflective electrodes 208 (block 704, see FIG. 8B) on the piezoelectric film or membrane 210. As discussed above, the electrodes 208 may be alternating layers 806, 808 of metal such as Al and W. Alternatively, other low acoustic impedance metals may be used instead of aluminum. In place of W, Molybdenum (Mo), Iridium (Ir), Platinum (Pt), or other high acoustic impedance metals may be used. In an exemplary aspect, a low impedance metal layer 806 may be adjacent to the piezoelectric membrane 210. A further buffer layer 810 (e.g., sapphire—Aluminum Oxide (Al$_3$O$_3$), Silicon Nitride (SiN), or other dielectric material) may be positioned atop the electrodes 208 and chemically mechanically polished to provide a smooth surface 812. Period 814 shows one period of the interdigitated structure (i.e., the fingers).

Figure 8A:
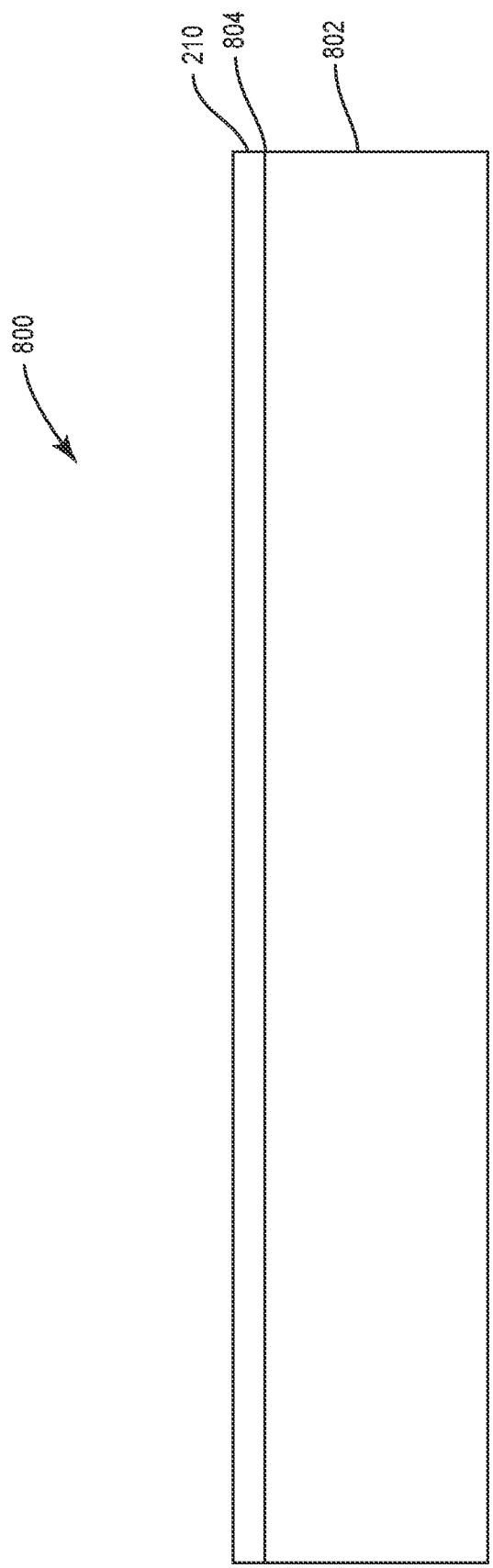
FIGS. 8A-8J are cross-sectional side elevation views of various steps of the flowchart of FIG. 7.
Figure 8B:
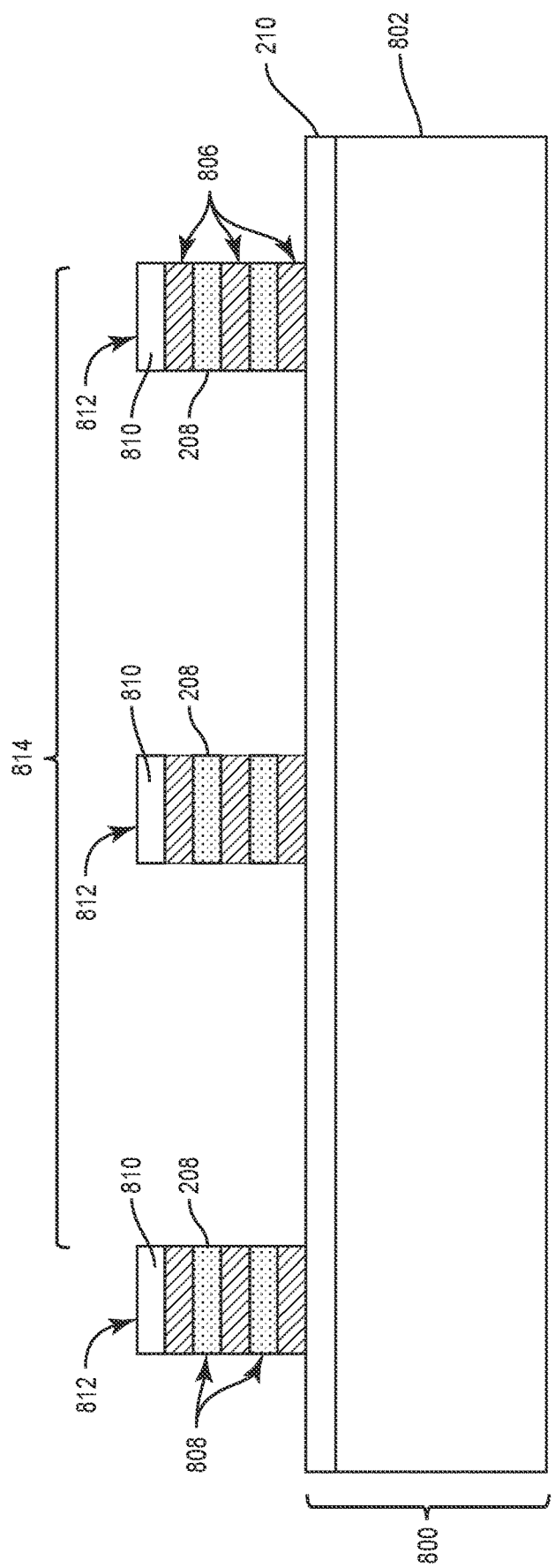
Figure 8C:
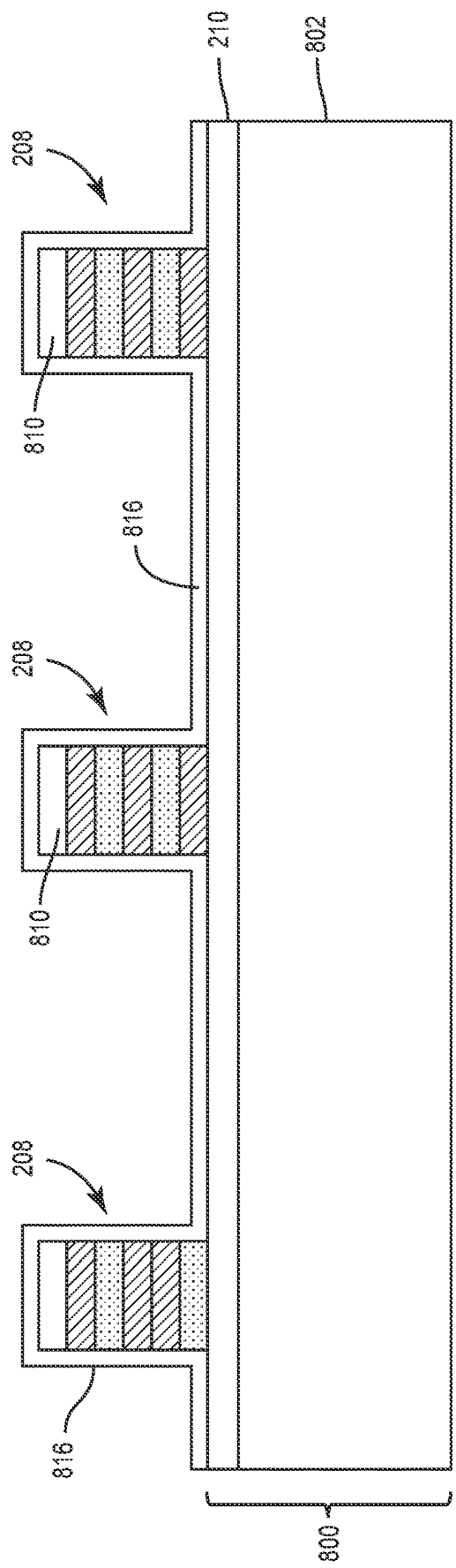

The process 700 continues by depositing a barrier layer 816 for a sacrificial layer etch (block 706, see FIG. 8C). In an exemplary aspect, the barrier layer 816 may be sapphire—Al$_2$O$_3$, SiN, titanium oxide (TiO$_2$), or the like.

Figure 8D:
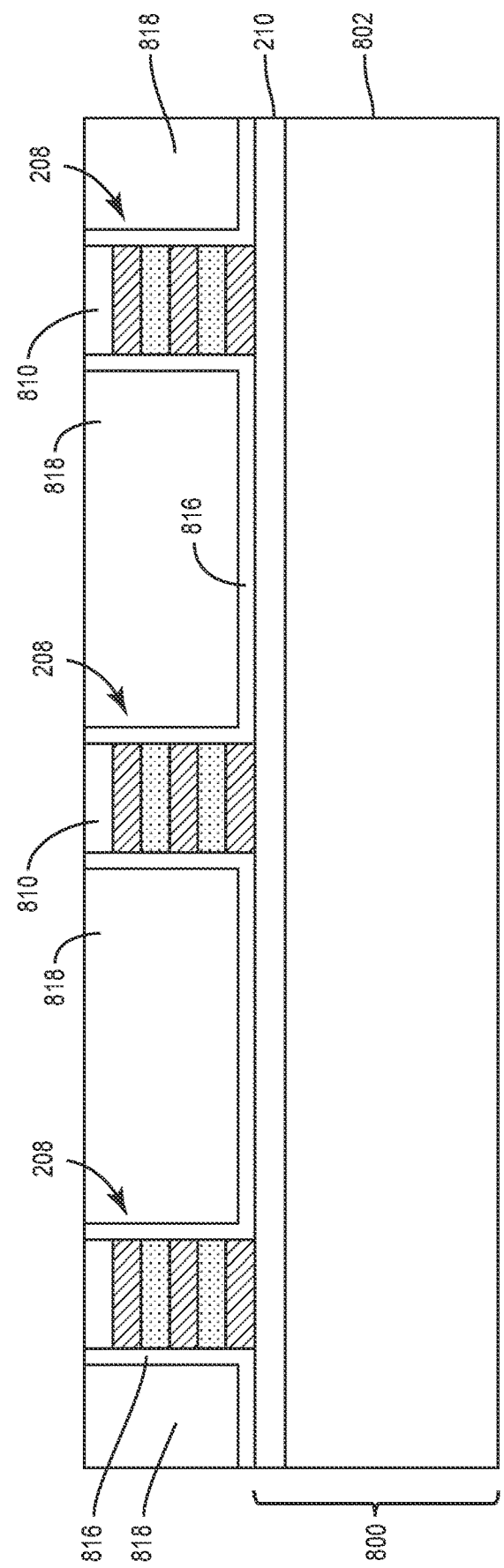

The process 700 continues by depositing a sacrificial layer 818 and planarizing the sacrificial layer 818 (block 708, see FIG. 8D). In an exemplary aspect, the sacrificial layer 818 may be SiO$_2$, a metal, or a polymer having an etch resistance different than the barrier layer 816.

Figure 8E:
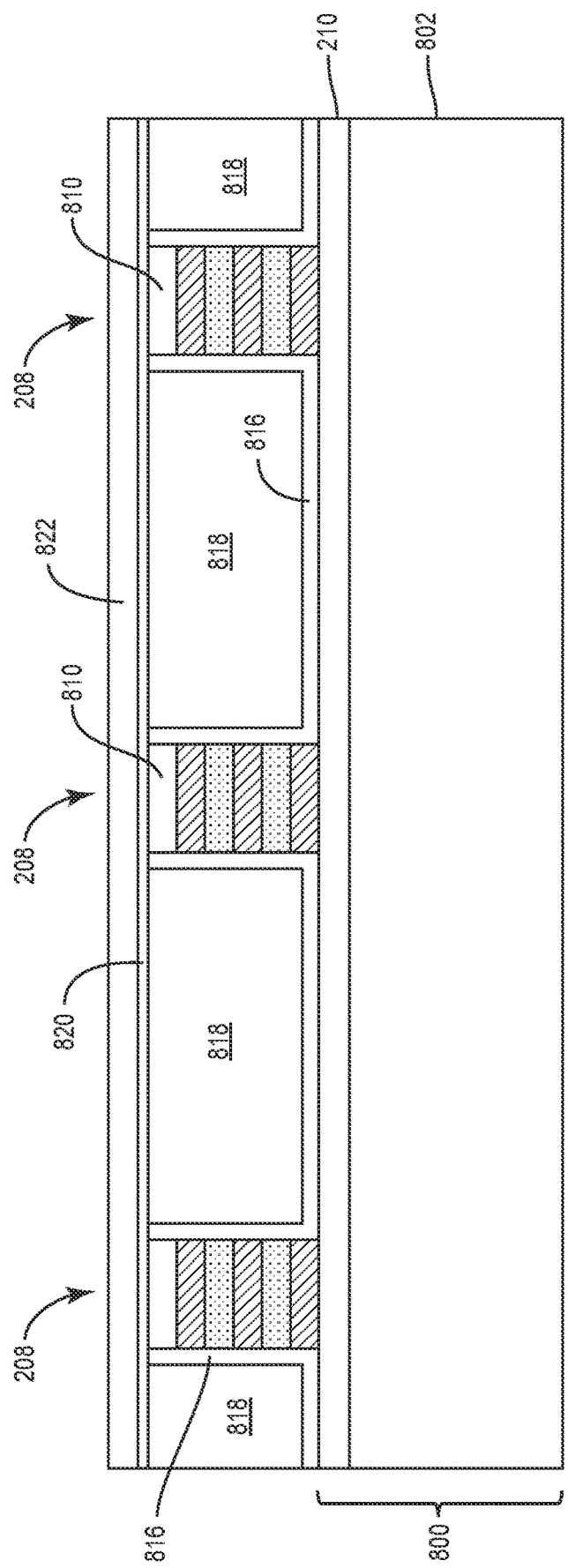

The process 700 continues by depositing an optional barrier layer 820 and/or a bonding layer 822 (block 710, see FIG. 8E). The barrier layer 820 may be the same material as the barrier layer 816. The bonding layer 822 may be a dielectric, polymer, or the like.

Figure 8F:
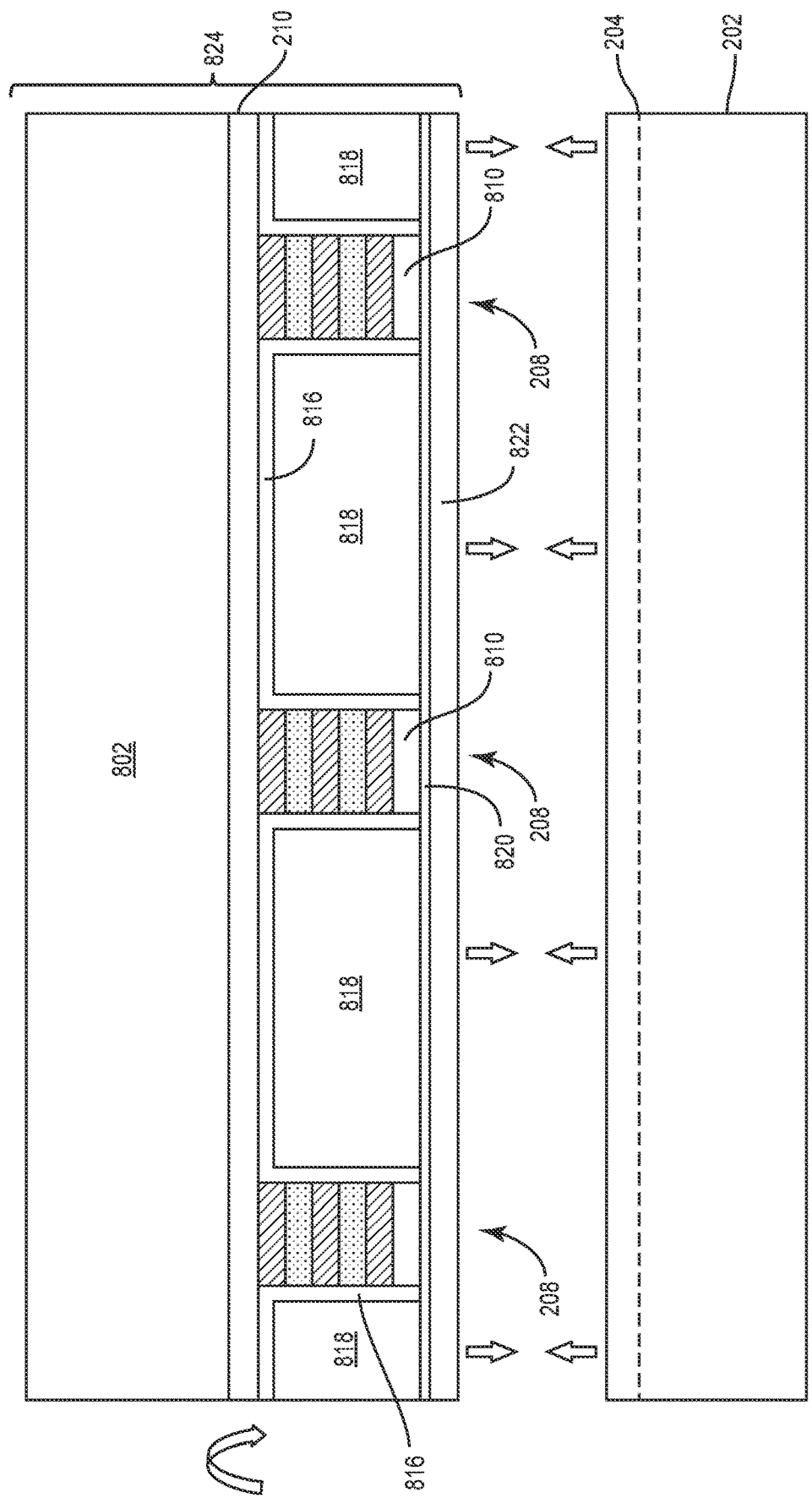

The process 700 continues by flipping the assembly 824 and bonding to the substrate 202 (block 712, see FIG. 8F). The substrate 202 may include the low permittivity layer 204. The substrate 202 may be silicon, silicon carbide (SiC), sapphire, glass, quartz, or the like.

Figure 8G:
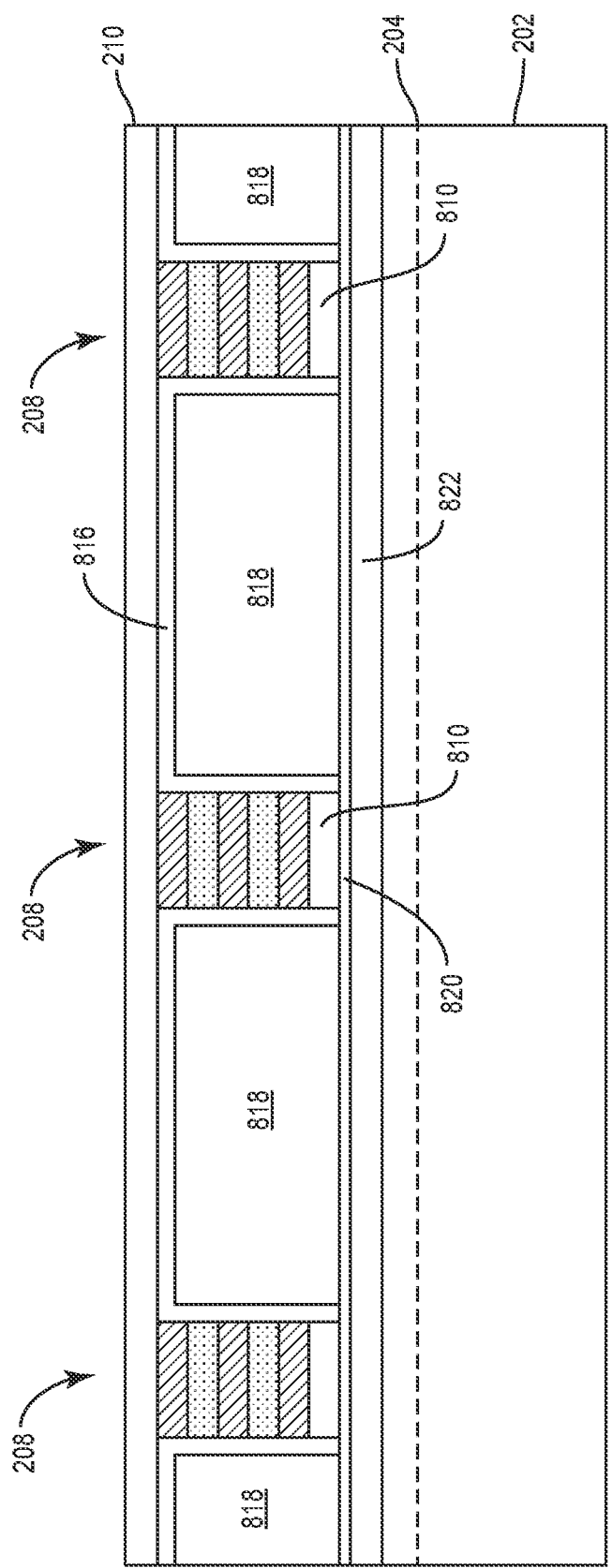

The process 700 continues by removing the carrier substrate 802 (block 714, see FIG. 8G). This exposes the piezoelectric membrane 210 and may be done by polishing, etching, or the like.

Figure 8H:
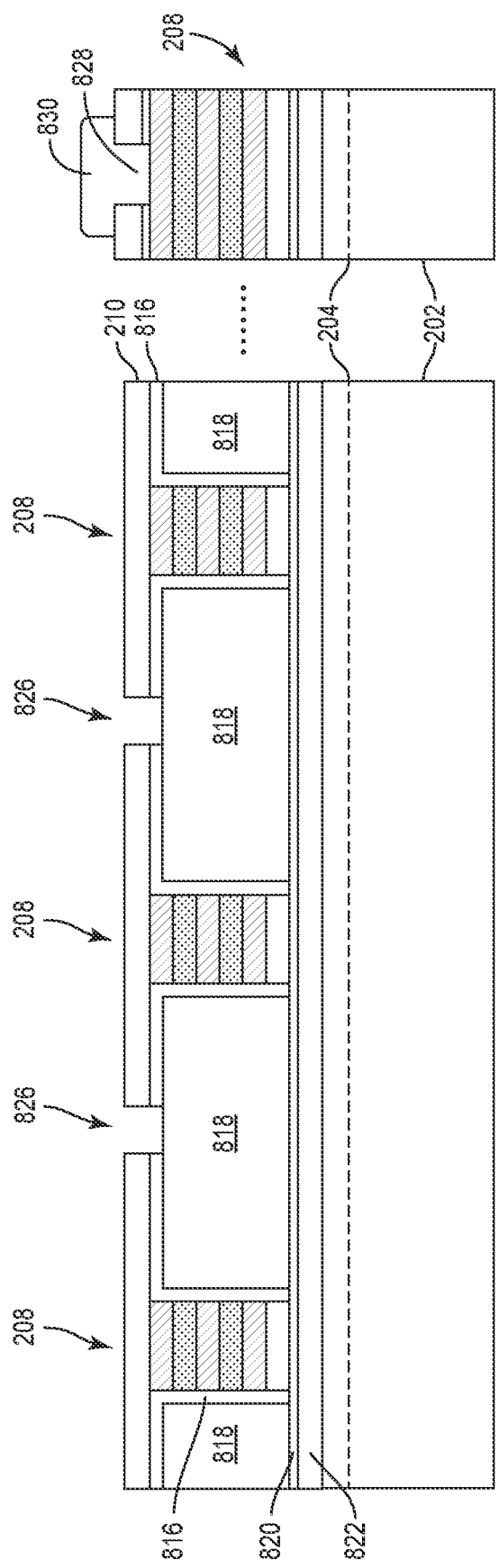
Figure 8I:
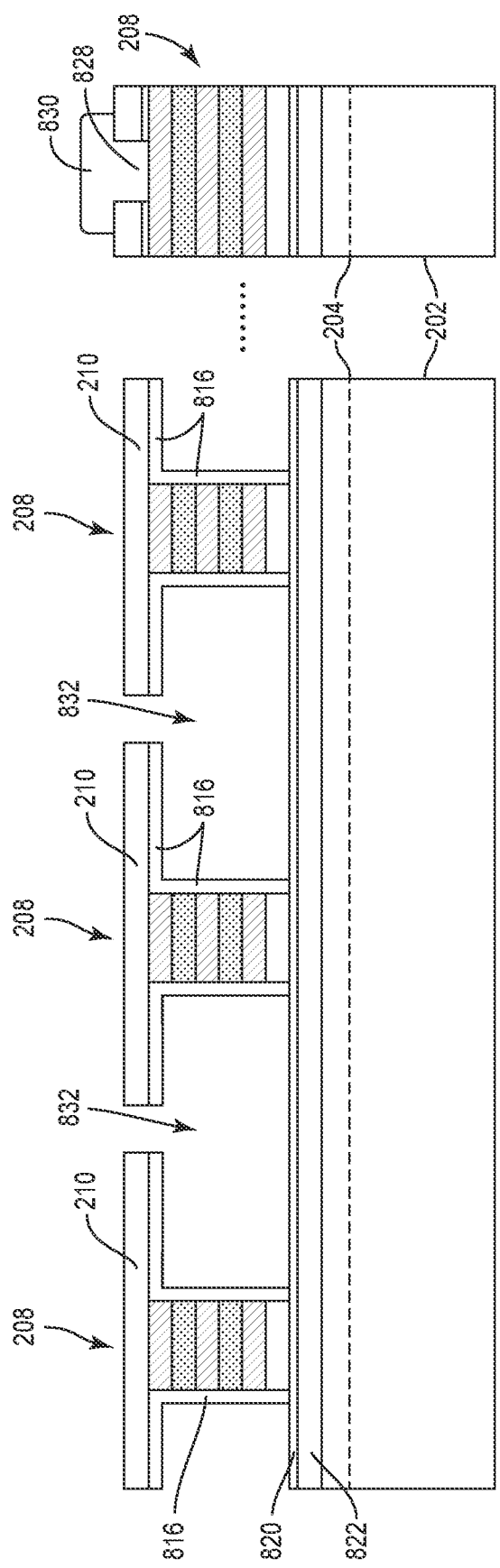

The process 700 continues by patterning the piezoelectric membrane 210 for electrical contact to electrodes and sacrificial release holes and to create electrical contacts (under barrier metal, (UBM)) (block 716, see FIG. 8H). Specifically, voids 826 may be made in the piezoelectric membrane 210 between the electrodes 208 by etching, cutting, or the like to expose the sacrificial layer 818. Additional voids 828 may be made through the piezoelectric membrane 210 over the electrodes 208 and filled with a contact metal 830 to form a UBM.

The process 700 continues by etching the sacrificial layer 818 (block 718, see FIG. 8I) through the voids 826 to create air cavities 832 between the electrodes 208. The etching may be done using any appropriate material that interacts and dissolves the sacrificial layer 818 but does not interact (or interacts substantially slower) with the barrier layers 816, 820.

Figure 8J:
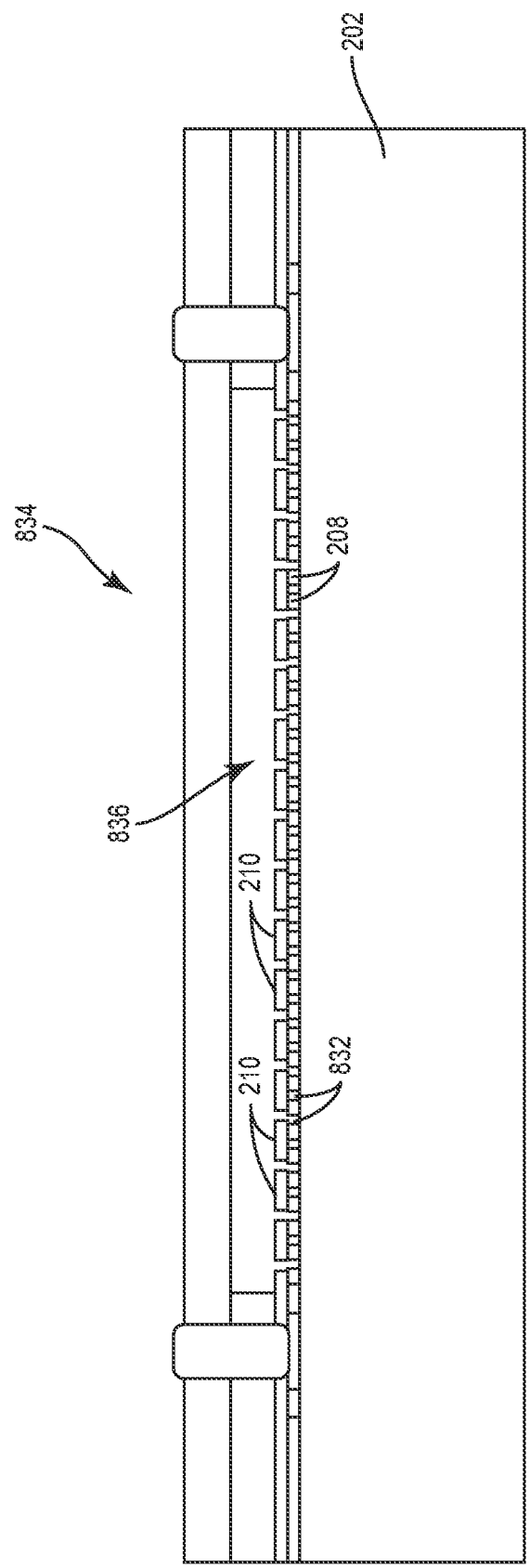

The process 700 concludes by forming a wafer level package (WLP) device 834 (block 720, see FIG. 8J). The WLP device 834 may have an air cavity 836 that is fluidly coupled to the air cavities 832 between the electrodes 208.

It should be appreciated that other processes may be used to form the resonators of the present disclosure without departing from the present disclosure. However, the process 700 is provided in the interests of completeness.

The resonator 200 allows both good thermal dissipation and high electroacoustic coupling. While not required, the multilayer electrodes 208 help prevent acoustic energy leak into the substrate 202. As a further note, the thickness of the layers 806, 808 within the electrodes 208 may be chosen to be close to a quarter wavelength for the chosen acoustical mode at resonance. For example, since a shear mode is excited in LiNbO$_3$, the layer thicknesses are close to a quarter wavelength of the shear mode.

Resonators such as the resonator 200 may be used in a ladder filter. Ladder filters are well known, albeit without the resonators of the present disclosure. Ladder filters include resonators at two or more different frequencies. Normally, the shunt resonators have a lower frequency than the series resonators. This may be done using a variation in electrode period (e.g., the spacing between the electrodes 208).

Another way to change the frequency is to etch selectively the piezoelectric membrane 210. Such etching may increase the frequency of the series resonators. Another approach is to selectively add a dielectric material on a free surface of the piezoelectric membrane 210, which will modify the frequency of the shunt resonators. These approaches are not mutually exclusive. Material may also be added to change the thermal characteristics of the resonator 200. For example, silicon dioxide (SiO$_2$) may be added on a top surface of the piezoelectric membrane. Since SiO$_2$ has a positive temperature coefficient, it can compensate for the negative temperature coefficient of most piezoelectric materials.

Figure 9:
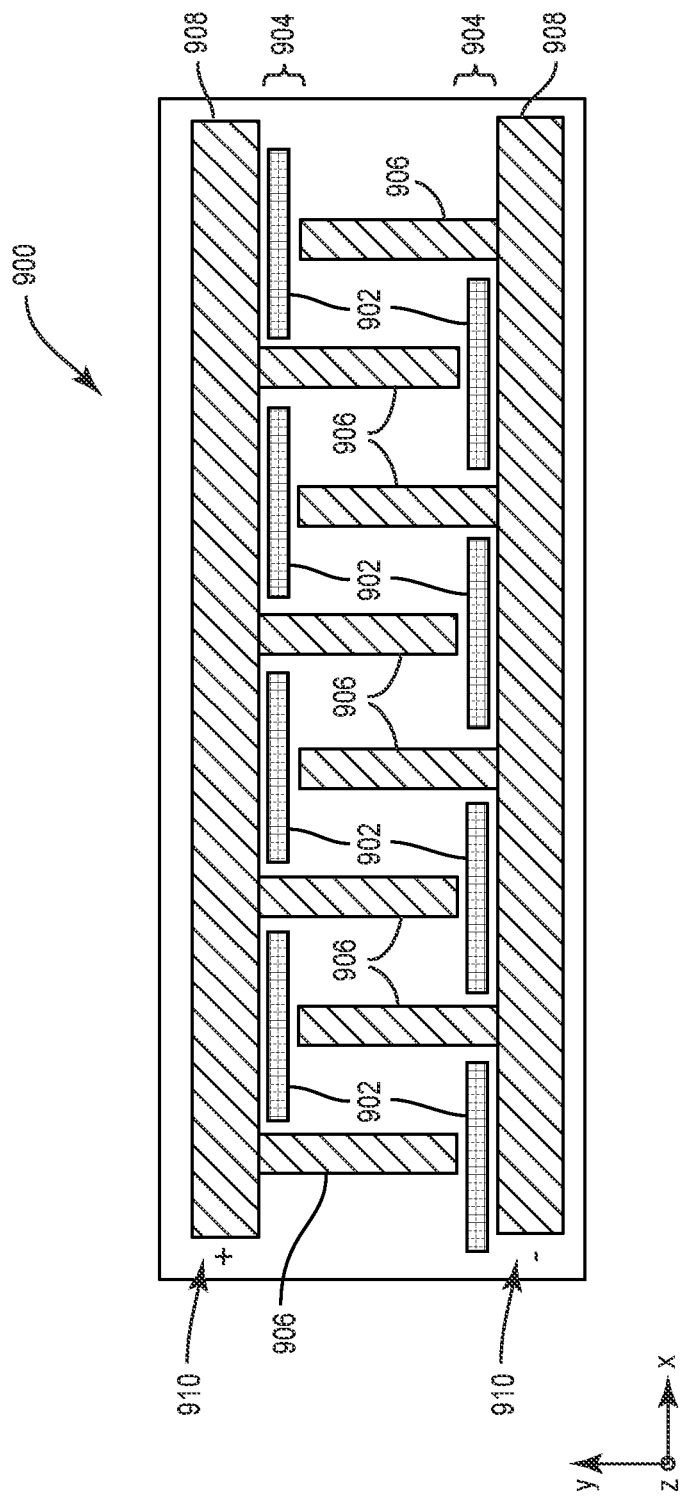
FIG. 9 is a top plan view of an alternate aspect of the resonator of FIG. 2 with holes to suppress transverse spurious modes.

While the resonator 200 is adequate to meet many needs, further variations are possible. For example, there may be multiple modes guided in the aperture of the resonators when they are combined into a ladder filter or the like. To suppress the coupling of such spurious modes, a slow region at the edge of the aperture may be used. Alternatively, the edge of the aperture can be released as illustrated in FIG. 9 by resonator 900, which has holes or voids 902 at edges 904 between fingers 906 and cross bar portions 908 of the electrodes 910.

Another issue that may occur is the presence of low-frequency modes propagating through the membrane. Given multiple fingers on the electrodes, these modes may generate performance-impacting spurs at resonant frequencies. To avoid coupling between the resonators, etching between the electrodes may be used. FIGS. 10-13 illustrate various configurations for such etching.

Figure 10:
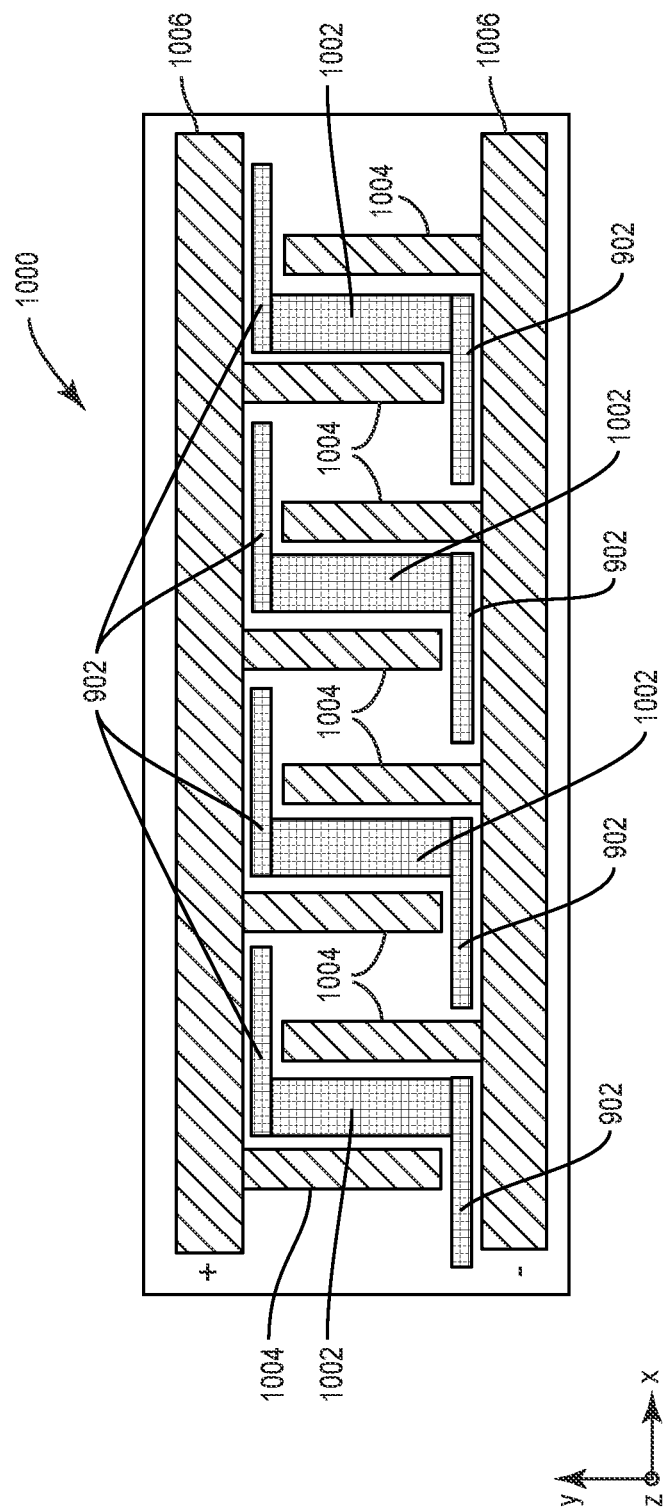
FIG. 10 is a top plan view of an alternate aspect of the resonator of FIG. 2 with holes to modify undesired possible low-frequency coupling between electrodes.

In this regard, FIG. 10 illustrates a resonator 1000 with relatively thick voids 1002 between the fingers 1004 of the electrodes 1006. The voids 1002 may connect voids 902 and provide isolation between different ones of the fingers 1004, but not others. While the voids 1002 are shown parallel to the fingers 1004, it should be appreciated that the voids 1002 may be formed as slants or oblique lines that are not parallel to the fingers 1004 without departing from the present disclosure.

Figure 11:
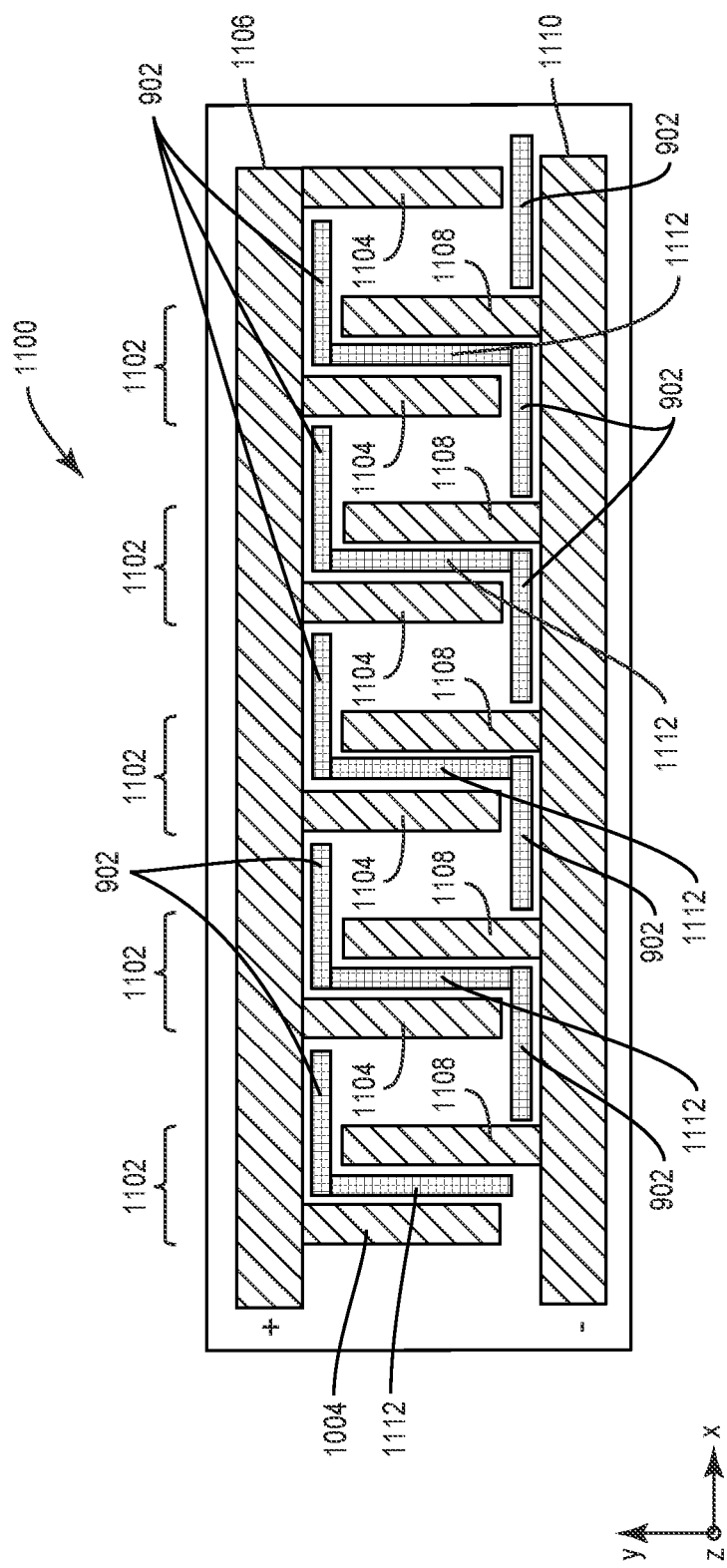
FIG. 11 is a top plan view of an alternate aspect of the resonator of FIG. 2 with holes to modify undesired possible low-frequency coupling between electrodes and transverse modes

Instead of having uniformly-spaced fingers, such as the fingers 906, 1004, the fingers may be paired with close spacing between pairs of fingers and a large gap between pairs. FIG. 11 illustrates a resonator 1100 with finger pairs 1102 spaced apart from one another. Each finger pair 1102 has a finger 1104 from a positive electrode 1106 and a finger 1108 from a negative electrode 1110. Voids 1112 are positioned between the fingers 1104, 1108 of each finger pair 1102.

Figure 12:
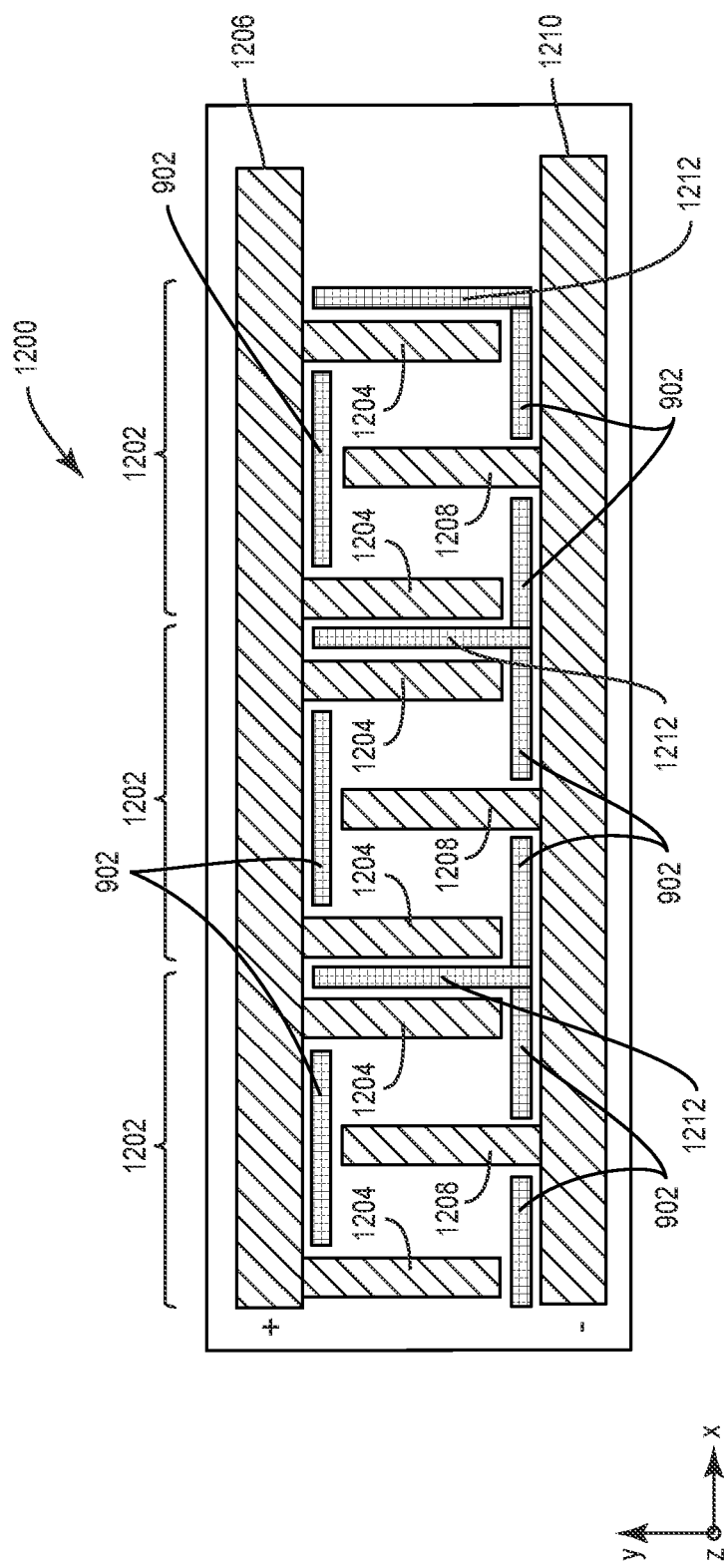
FIG. 12 is a top plan view of an alternate aspect of the resonator of FIG. 2 with holes to modify undesired possible low-frequency coupling between electrodes and transverse modes.

FIG. 12 illustrates a resonator 1200 having finger triads 1202, where as illustrated, a finger triad 1202 includes two fingers 1204 from a positive electrode 1206 and one finger 1208 from a negative electrode 1210. Different finger triads 1202 are separated from one another by voids 1212. Edge voids 902 may also be present and may couple to the voids 1212 as shown.

Figure 13:
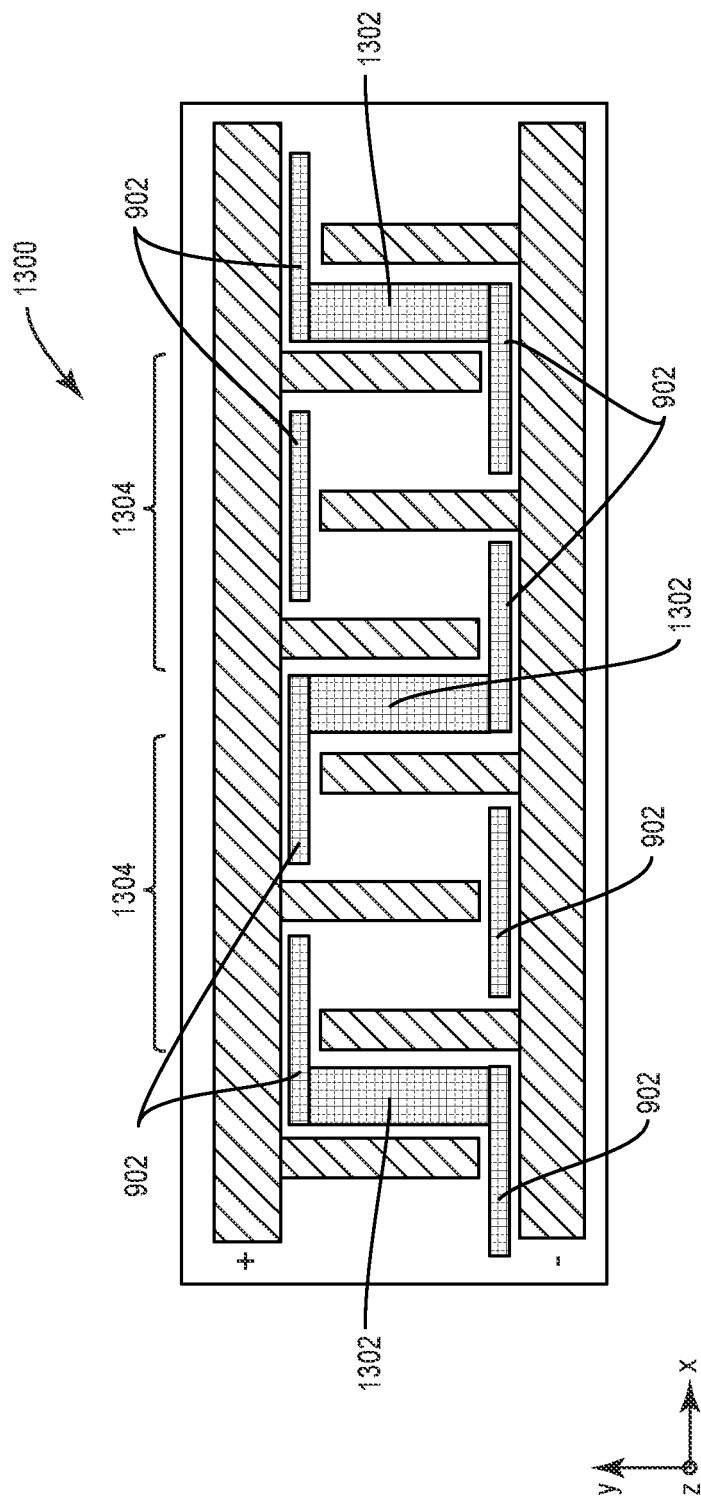
FIG. 13 is a top plan view of an alternate aspect of the resonator of FIG. 2 with holes to modify undesired possible low-frequency coupling between electrodes and transverse modes.

FIG. 13 illustrates a resonator 1300 with still another void geometry. Voids 1302 may couple to edge voids 902 as shown and may also separate groups of three fingers 1304.

Other geometries of voids and finger groupings may also be used without departing from the present disclosure, and these geometries are merely exemplary.

While the present disclosure is focused on providing solutions at frequencies above 2.5 GHz, it should be appreciated that aspects of the present disclosure may be used for resonators operating below 2.5 GHz, and the claims are not limited to specific frequencies except where explicitly noted.

Figure 14:
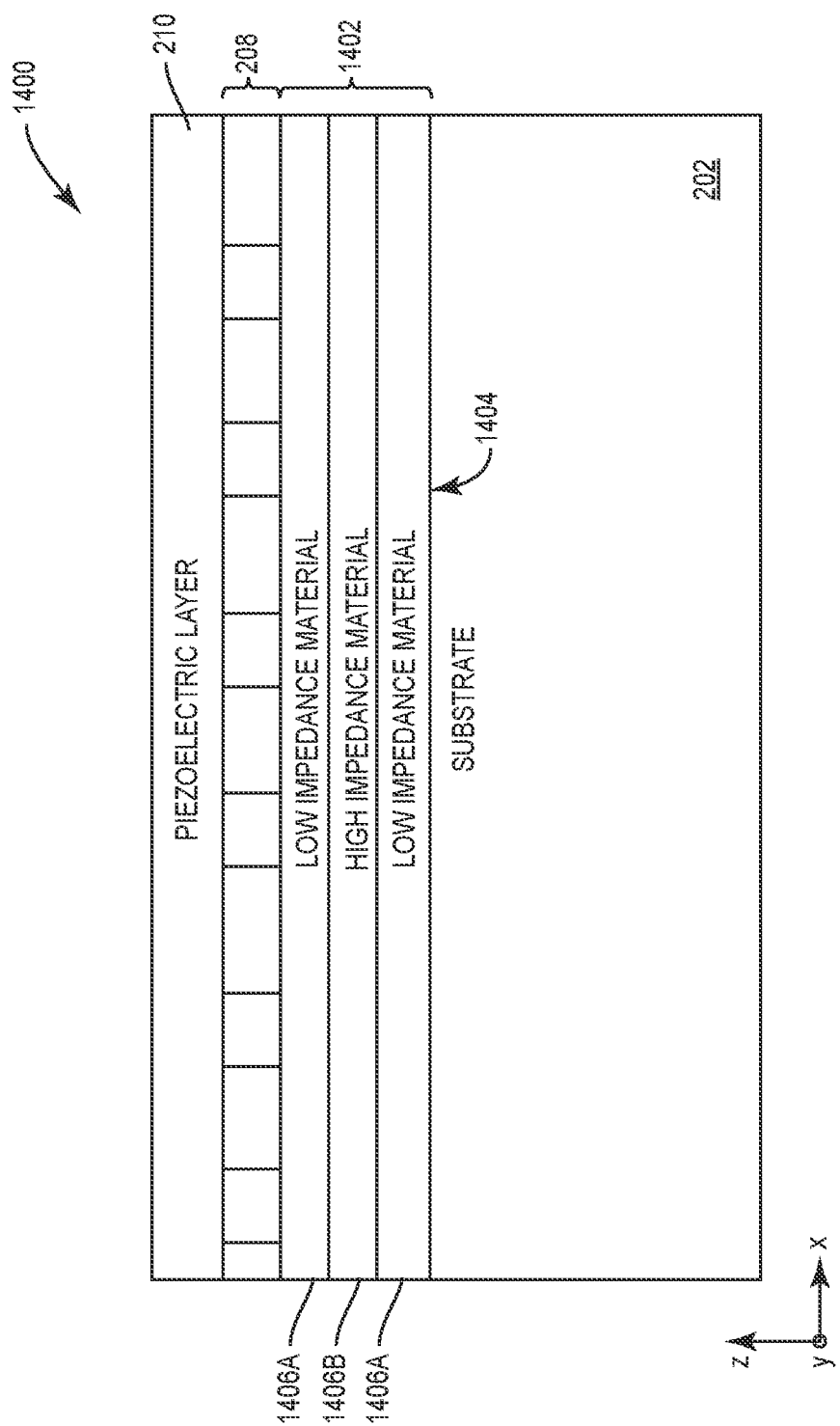
FIG. 14 is a cross-sectional view of an alternate aspect with a Bragg reflector on a substrate.

In addition to the various aspects discussed above, there may be instances where it is desirable to avoid acoustic energy leakage in a substrate. One such solution is a multilayer Bragg reflector at a surface of the substrate, as is better seen in FIGS. 14 and 15. Thus, a device 1400 may include the substrate 202 with a reflector 1402 on a surface 1404. Electrodes 208 are mounted on the reflector 1402, and a piezoelectric film 210 is on top of the electrodes 208.

In an exemplary aspect, the reflector 1402 is formed from a succession of low impedance layers 1406A and high impedance layers 1406B. Each layer 1406A, 1406B may have a thickness (i.e., along z-axis) approximately one-quarter of the shear mode wavelength. The low impedance layer 1406A may be made from a material such as silicon oxide or aluminum. The high impedance layer 1406B may be made from a material such as hafnium oxide, hafnium nitride, aluminum oxide, silicon nitride, tantalum tungsten, or platinum. These reflective layers may be combined with reflective layers in the electrodes 208. If the electrodes 208 are made from a low impedance material like aluminum, a low impedance material like silicon oxide may be a top layer on the substrate 202. In this case, the sum of the electrode thickness in wavelengths and the layer thickness in wavelengths may be close to a multiple of a quarter wavelength. If the first layer on substrate 202 is a high impedance material, it may be advantageous to choose the thickness of the electrode to be close to a quarter wavelength. If the first material is a low impedance material and silicon oxide is chosen, then the low dielectric constant is helpful to avoid coupling reduction.

Figure 15:
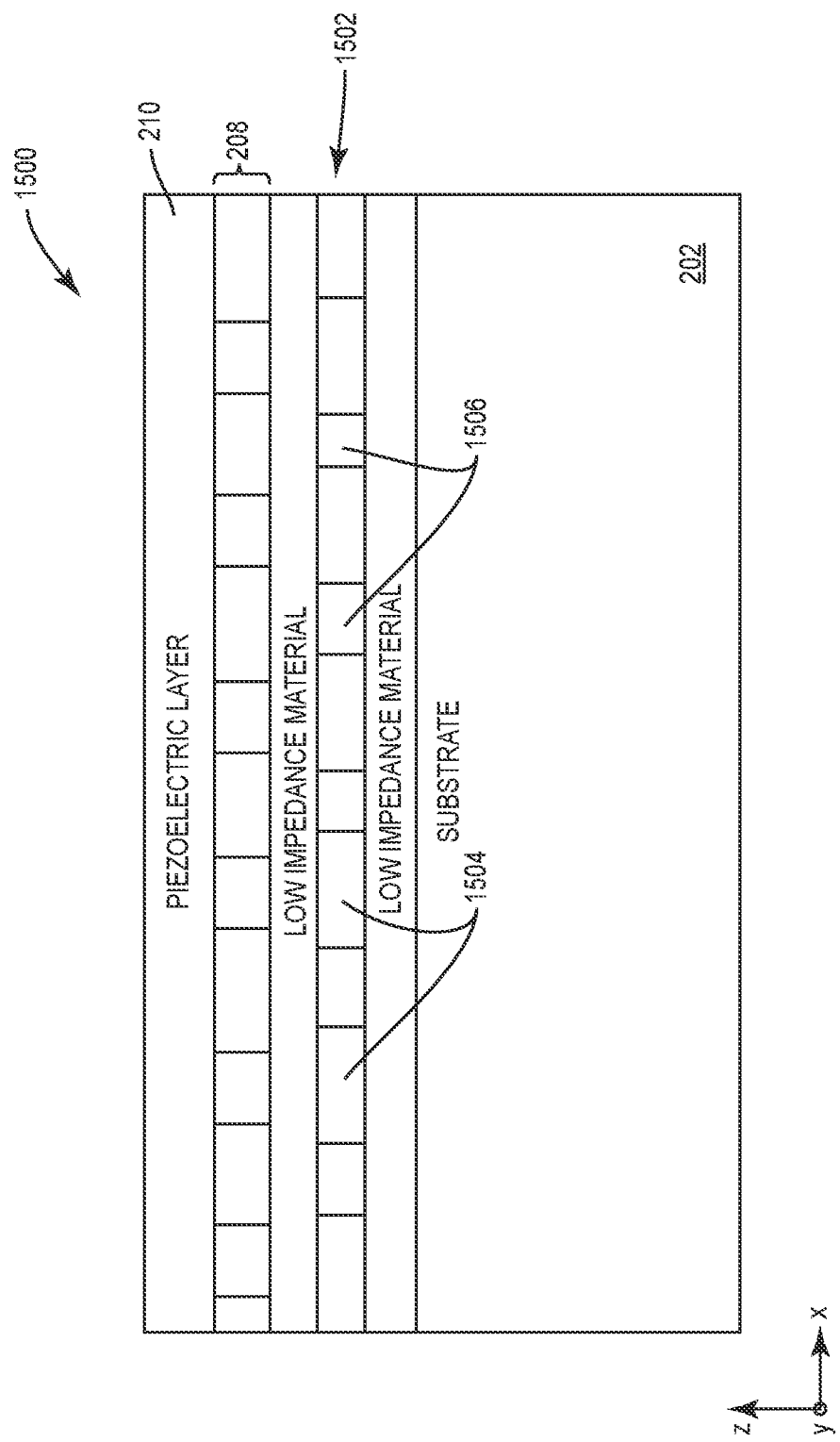
FIG. 15 is a cross-sectional view of an alternate aspect of the device of FIG. 14.

FIG. 15 illustrates device 1500, where, if one of the layers 1502 on the substrate 202 is metallic, to avoid a reduction coupling, the layer 1502 may be discontinuous (shown by voids or gaps 1504). For example, the void may be filled by silicon oxide to make the structure more solid.

While not shown, the electrodes may be partially embedded in the piezoelectric membrane to also improve the coupling and reduce the spurious modes.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A resonator comprising:
a piezoelectric membrane for which excitation is done using electrodes at alternate polarities such that:
the electrodes are placed between the piezoelectric membrane and a substrate and the electrodes delimit an air filled gap therebetween, wherein the electrodes are made of a plurality of layers of metal and wherein each of the plurality of layers of metal comprises a corresponding layer thickness, and a majority of the layer thicknesses are approximately a multiple of a quarter wavelength of a shear acoustic mode in a material around a frequency of the resonator.

2. The resonator of claim 1, wherein the plurality of layers of metal comprise a low acoustical impedance metal and a high acoustical impedance metal.

3. The resonator of claim 2, wherein the low acoustical impedance metal comprises aluminum (Al).

4. The resonator of claim 2, wherein the high acoustical impedance metal comprises tungsten (W).

5. The resonator of claim 2, wherein the high acoustical impedance metal comprises platinum (Pt).

6. The resonator of claim 1, further comprising a low permittivity material between the electrodes and the substrate.

7. The resonator of claim 6, wherein the low permittivity material comprises silicon oxide (SiO).

8. The resonator of claim 1, wherein the substrate comprises silicon (Si), silicon carbide (SiC), sapphire ($Al_2O_3$), or quartz.

9. The resonator of claim 1, wherein the piezoelectric membrane comprises lithium niobate ($LiNbO_3$) or lithium tantalate ($LiTaO_3$).

10. The resonator of claim 9, wherein a Z axis of a crystal of the piezoelectric membrane is parallel to a normal to plane.

11. The resonator of claim 10, wherein the piezoelectric membrane is $LiNbO_3$ and the normal to the plane is between Y+100 and Y+140.

12. A process to make the resonator of claim 1 comprising bonding the piezoelectric membrane to the electrodes on the substrate.

13. The process of claim 12, further comprising forming the piezoelectric membrane by thinning a piezoelectric wafer.

14. The process of claim 13, further comprising implanting the piezoelectric wafer to create defects that define the piezoelectric membrane.

15. A resonator comprising:
a substrate;
a reflector positioned on a surface of the substrate;
electrodes having an air gap therebetween, the electrodes mounted on the reflector; and
a piezoelectric membrane for which excitation is done using the electrodes at alternate polarities, wherein the piezoelectric membrane is positioned on the electrodes opposite the reflector.

16. The resonator of claim 15, wherein the reflector comprises a plurality of alternating low impedance layers and high impedance layers.

17. The resonator of claim 16, wherein each layer of the plurality of alternating low impedance layers and high impedance layers is approximately one-quarter of a shear mode wavelength.

18. The resonator of claim 16, wherein at least one high impedance layer comprises a material selected from the group consisting of hafnium oxide, hafnium nitride, aluminum oxide, silicon nitride, tantalum, tungsten, or platinum.

* * * * *